United States Patent
Giehl et al.

[11] Patent Number: 5,432,682
[45] Date of Patent: Jul. 11, 1995

[54] AT COMPUTER CARD MOUNTING BRACKET

[75] Inventors: Kevin Giehl; David Brandt, both of Milwaukee; David Franke, Menasha, all of Wis.

[73] Assignee: RAAC Technologies, Inc., Milwaukee, Wis.

[21] Appl. No.: 9,828

[22] Filed: Jan. 27, 1993

[51] Int. Cl.⁶ .............................................. H05K 7/14
[52] U.S. Cl. ................................... 361/796; 361/740; 361/747; 361/754; 361/801; 361/802; 211/41; 439/64
[58] Field of Search ............................ 361/730–732, 361/752, 740–741, 747, 754, 756, 759, 796–798, 801–802, 825; 257/668, 693, 784; 174/260; 206/334; 439/64; 211/41

[56] References Cited

U.S. PATENT DOCUMENTS

| | | | |
|---|---|---|---|
| 4,478,331 | 10/1984 | Ruin | 206/334 |
| 5,216,578 | 6/1993 | Zenitani et al. | 439/64 |
| 5,293,303 | 3/1994 | Fletcher et al. | 439/64 |

Primary Examiner—Bot LeDynh
Attorney, Agent, or Firm—Schiff Hardin & Waite

[57] ABSTRACT

A mounting bracket is disclosed that is intended to be used, in conjunction with other identical mounting brackets, to facilitate the insertion and removal of certain printed circuit boards known as AT style cards into and out of passive backplane or motherboard slots in a computer housing, as well as to protect the AT style computer cards from damage while they are resident in the housing. The mounting bracket of the present invention is adaptable to fit an AT style card of any length, and is capable of providing close spacing between inserted cards.

15 Claims, 8 Drawing Sheets

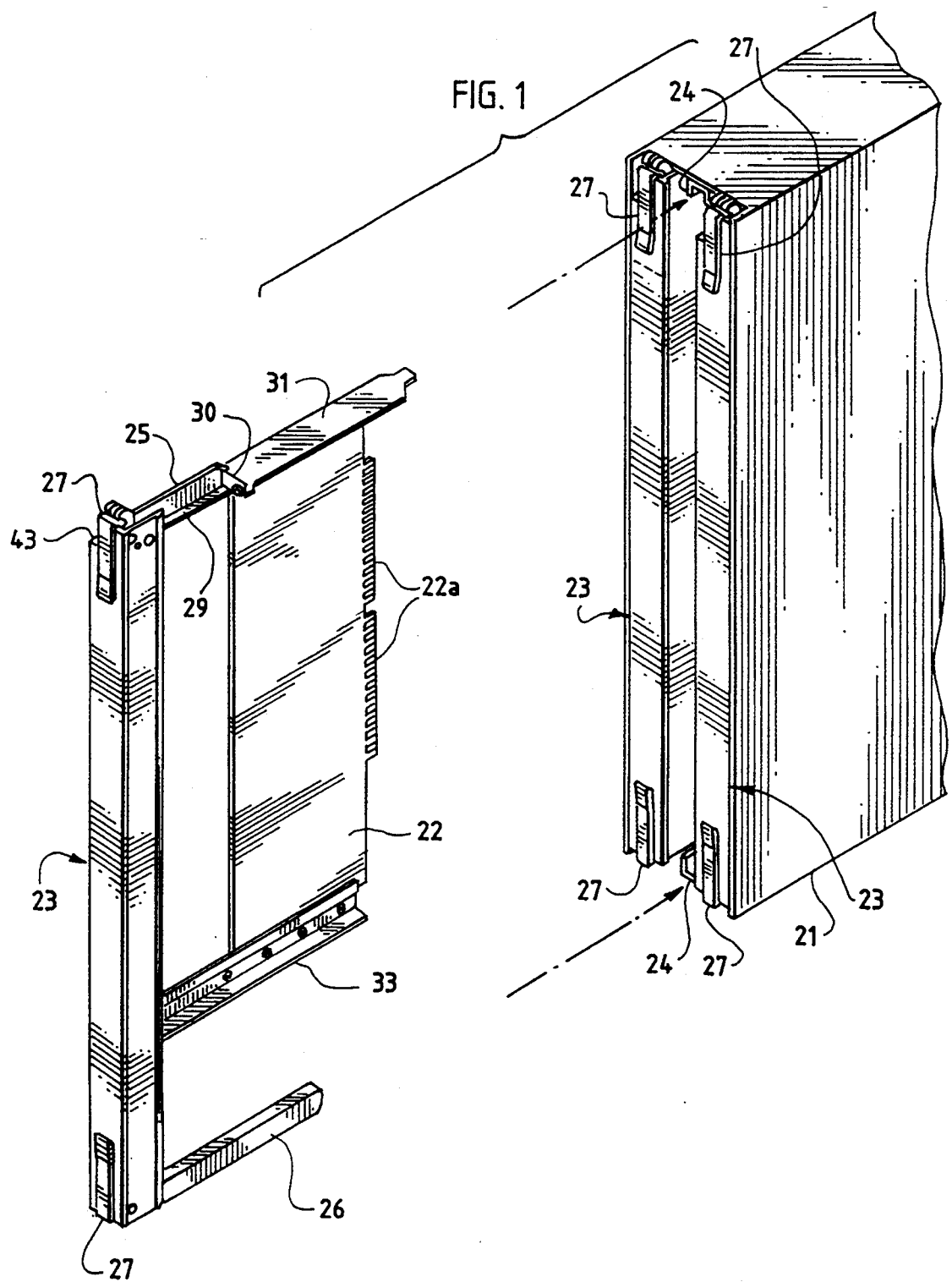

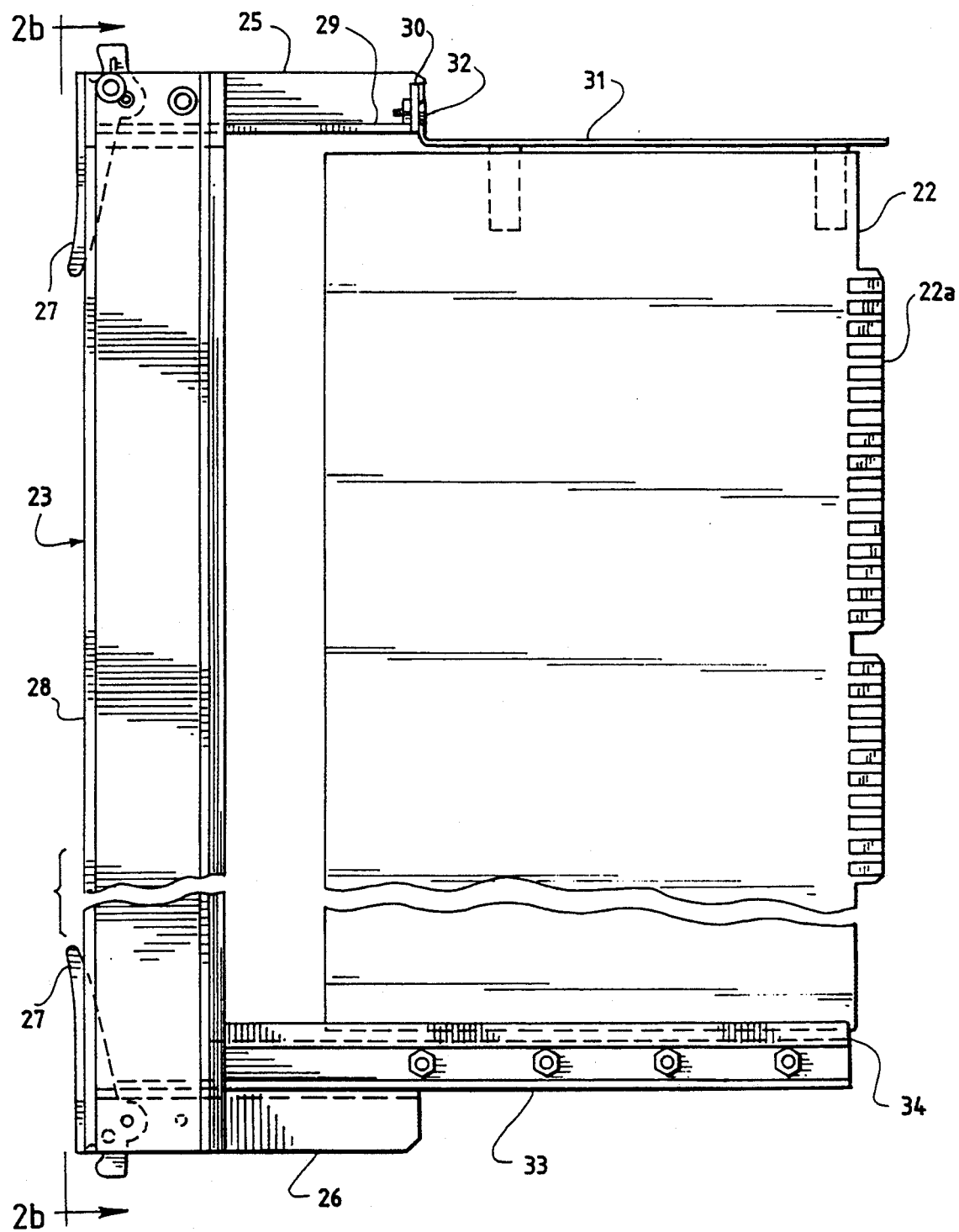

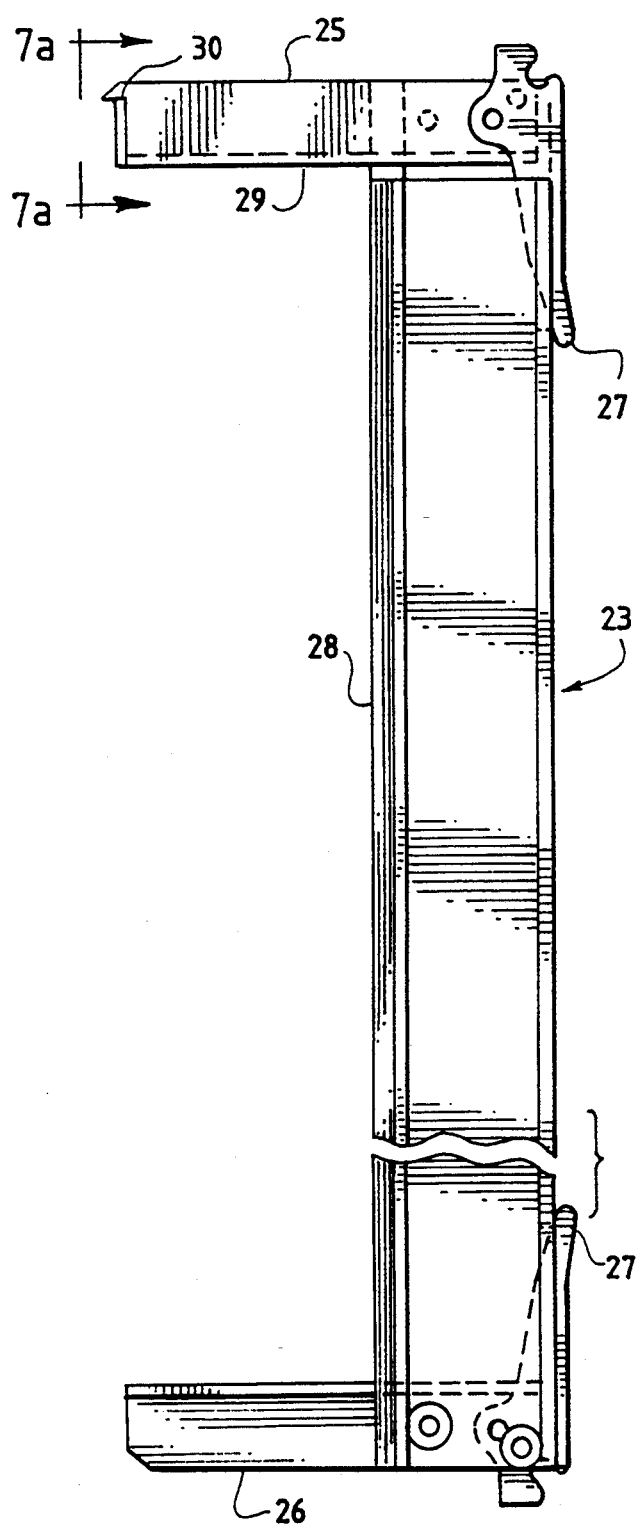
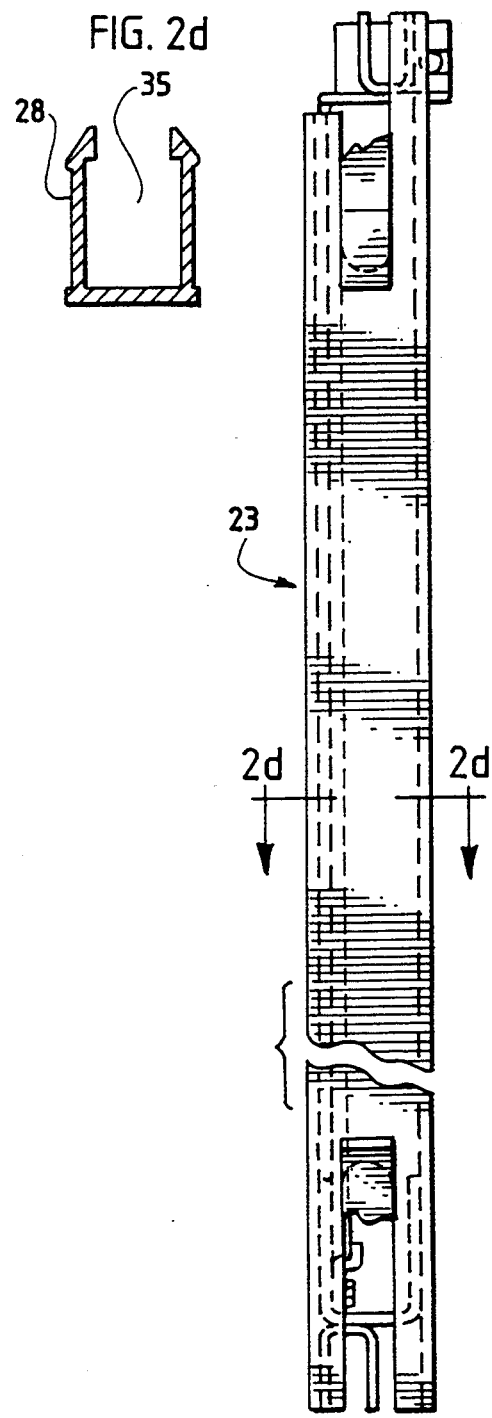

FIG. 6
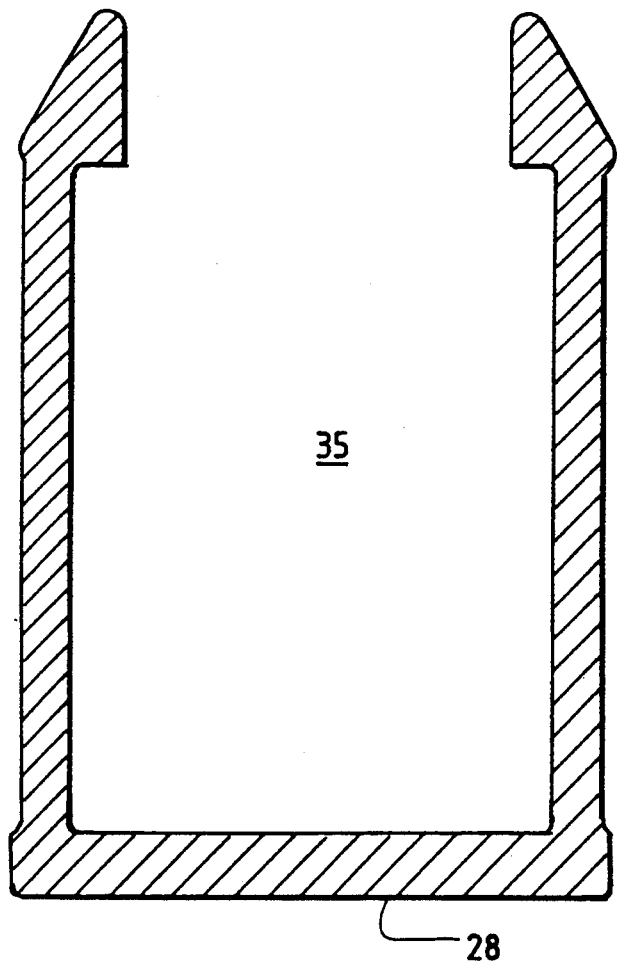
FIG. 7d
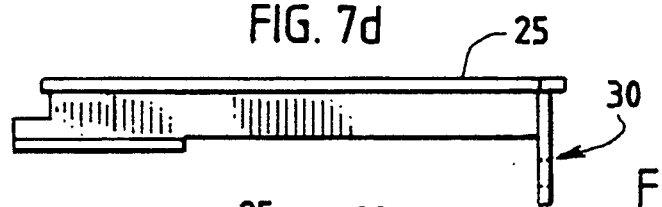
FIG. 7c
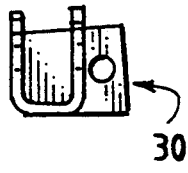
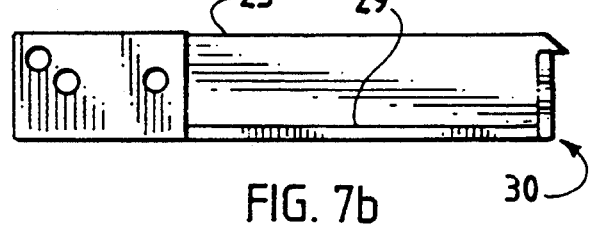
FIG. 7b
FIG. 7a
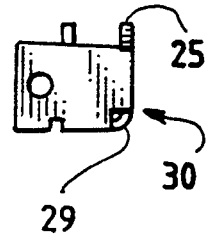

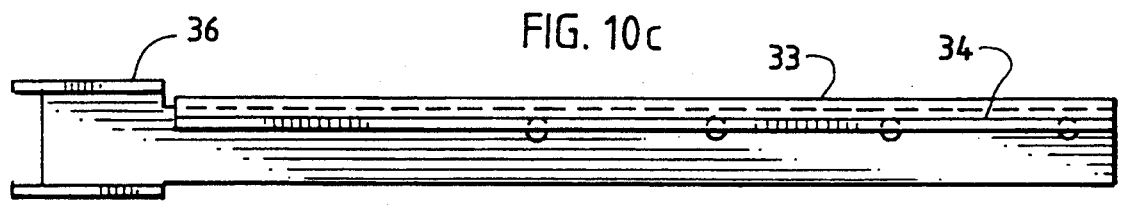
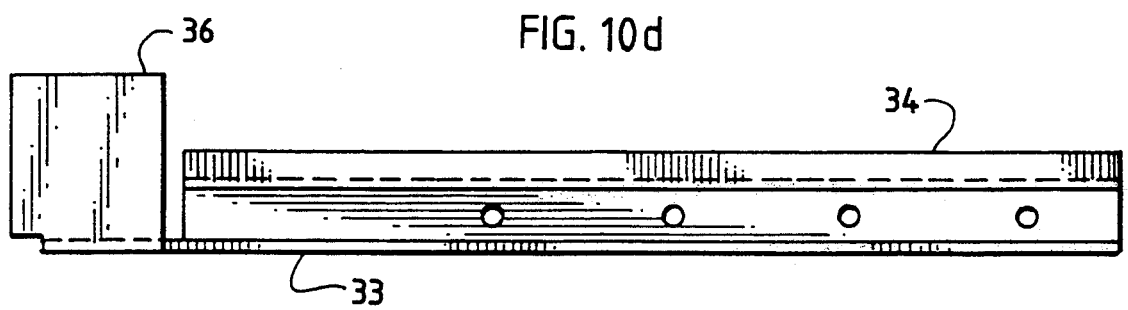
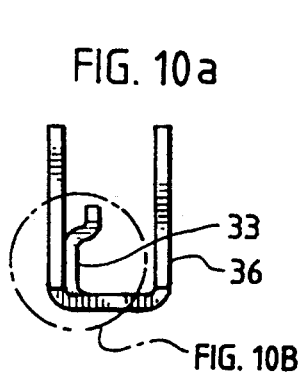
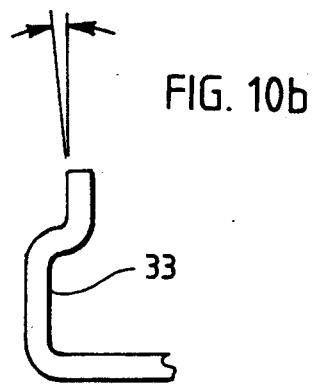
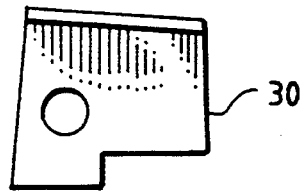
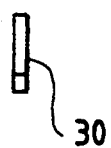
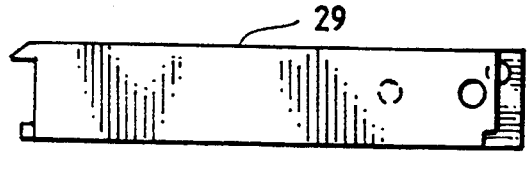

AT COMPUTER CARD MOUNTING BRACKET

BACKGROUND OF THE INVENTION

The present invention is a mounting bracket that is designed to be used with a commonly available type of printed circuit board, or computer card, called an "AT style card." AT style cards are so named because they are compatible with certain industry-standard bus configurations including but not limited to AT, PC, ISA, EISA, PCI, VESA and Local Bus configurations.

Until now, AT style cards (hereafter, "AT cards") were inserted into motherboard or backplane slots either by free standing card insertion or with the aid of a containing module. The difficulty with free standing card insertion is that cards must be protected, and must therefore be inserted through or around a cumbersome protective enclosure. Such an enclosure frustrates rapid card insertion and removal. The advantage of free standing card insertion is that standard card density, i.e., 0.8 inches between adjoining card centers, is preserved.

Containing modules solve the problems of free standing card insertion, but raise a different issue. A standard containing module both protects the individual card it houses, and facilitates the easy insertion and removal of the card from a motherboard or backplane slot. But containing modules occupy more than one standard AT style motherboard or backplane slot per contained card. Thus containing modules increase the distance between adjoining card centers and limit the card density that is attainable within a particular computer housing.

A need exists for a simple device that provides protection for AT cards, ease of insertion into and removal from motherboard or backplane slots, and flexibility in adapting to various AT card lengths, while also preserving card density at the level associated with free standing card spacing (approximately 0.8 inches between card centers).

SUMMARY OF INVENTION

The invention is a new computer card mounting bracket ("mounting bracket") that holds electrically connected AT style computer cards ("AT cards") of various sizes. The mounting bracket of the present invention is intended to be used with AT computer products, including passive backplanes and motherboards based on any of the bus structures listed above (AT, PC, ISA, EISA, PCI, VESA and Local Bus configurations).

It is thus one object of the present invention to provide physical support for an AT style computer card ("AT card") that is electrically connected to a motherboard or backplane.

It is another object of the present invention to provide a mounting bracket that may be easily adjusted to accommodate any length AT card.

It is yet another object of the present invention to provide for close alignment of AT cards that are inserted in adjoining motherboard or backplane slots.

It is still another object of the present invention to provide for the easy insertion or extraction of AT cards to or from motherboard or backplane slots.

To achieve these and other objects, the mounting bracket of the present invention orients an AT card for insertion into a backplane or motherboard slot with the AT card edge connector pointing away from the spine of the mounting bracket. The AT card is attached at one edge to a standard AT card bracket, and at the other edge to a sliding AT card holder. The mounting bracket of the present invention engages the AT card bracket by means of an AT card bracket holder guide, and an AT card bracket holder. The AT card bracket holder guide is twisted or rotated such that the edges of adjoining AT card brackets appear "shingled" when the mounting brackets are inserted properly into the motherboard or backplane slots. This orientation facilitates the easy insertion and removal of the mounting brackets and attached AT cards, while preserving the standard spacing between AT cards.

The AT card is guided into a backplane or motherboard slot by top and bottom grooved guides in the housing which mate with top and bottom guides located on the mounting bracket. The mounting bracket is finally locked into place with spring loaded levers located at either end of its spine.

BRIEF DESCRIPTION OF THE DRAWINGS

FIG. 1 is a front perspective view of an embodiment of the invention illustrating a mounting bracket interfacing with an enclosure.

FIG. 2a is a side elevation view of the mounting bracket of the present invention attached to an AT card.

FIG. 2b is a front elevation view of the mounting bracket of the present invention.

FIG. 2c is a reverse side elevation view of a portion of the mounting bracket.

FIG. 2d is a cross-section of the spine of the mounting bracket taken along line 2d—2d.

FIG. 6 is a detailed drawing of a mounting bracket spine cross-section.

FIGS. 7a–7d are detailed drawings of the mounting bracket.

FIGS. 10a–10d are detailed drawings of one embodiment of a sliding plug and sliding AT card holder as depicted in FIG. 3.

FIGS. 11a–11b are detailed drawings of an AT card bracket holder guide.

FIGS. 12a–12b are detailed drawings of an AT card bracket holder and guide.

DESCRIPTION OF THE PREFERRED EMBODIMENT

Figure 3:
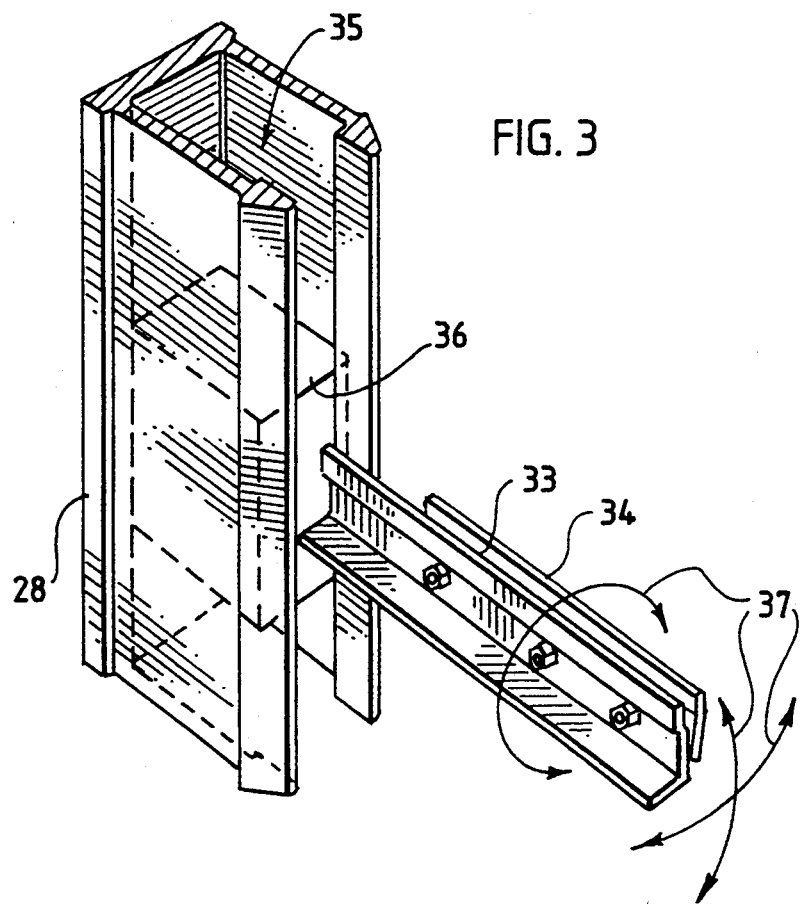
FIG. 3 is a perspective view of the spine of the mounting bracket.

Referring to the drawings, FIG. 1 shows a frontal view of a computer housing 21 that is capable of accommodating more than one AT style card ("AT card") 22. Mounting bracket 23 attaches to one edge of the AT card and may be inserted into and extracted from the computer housing. Upon insertion, the AT card edge connector 22a engages the motherboard or backplane slot. When the mounting bracket is inserted into the computer housing a protective barrier is formed to protect the AT card from damage.

Insertion and removal of the mounting bracket into or from the computer housing is guided by grooved guides 24 located in the housing and by guide rails 25 and 26 affixed to either end of the mounting bracket. Spring loaded locking/ejector lever 27 is located at either end of the mounting bracket for securing and releasing the mounting bracket.

FIG. 2a shows a view of mounting bracket 23 affixed to AT card 22. The mounting bracket has a two-sided spine 28 that is affixed at one end to an AT card bracket holder 29. The AT card bracket holder 29 is integral with the first guide rail 25 in the illustrated embodiment of the present invention. The AT card bracket holder is affixed to the AT card bracket holder guide 30 and commonly available AT card bracket 31 by fastening means 32. The AT card 22 is manufactured to mate and affix at one edge to AT card bracket 31. The opposite edge of AT card 22 is affixed to the mounting bracket using sliding card holder 33 and fastening means 34. Guide rail 26 is affixed to the other end of the mounting bracket spine 28.

FIG. 2b shows a front view of the mounting bracket. FIG. 2c shows a view opposite to that of FIG. 2a without any of the following attached: an AT card 22, an AT card bracket holder guide 30, and AT card bracket 31, fastening means 32 and sliding AT card holder 33. FIG. 2d shows a cross sectional view of mounting bracket spine 28 and the channel 35 formed by the two sides of the spine.

FIG. 3 illustrates the way that sliding AT card holder 33 slides along the spine 28 of the mounting bracket to adjust for AT cards 22 of various lengths. Channel 35 enables sliding plug 36 to slide between the sides of the spine 28. Sliding plug 36 has sliding AT card holder 33 functionally attached. The dimensional fit between channel 35 and sliding plug 36 allows sliding AT card holder 33 to slide along the length of mounting bracket spine 28 with minimal torsional deflection 37. Note sliding plug 36 may be embodied as an extension of sliding AT card holder 33.

Figure 4:
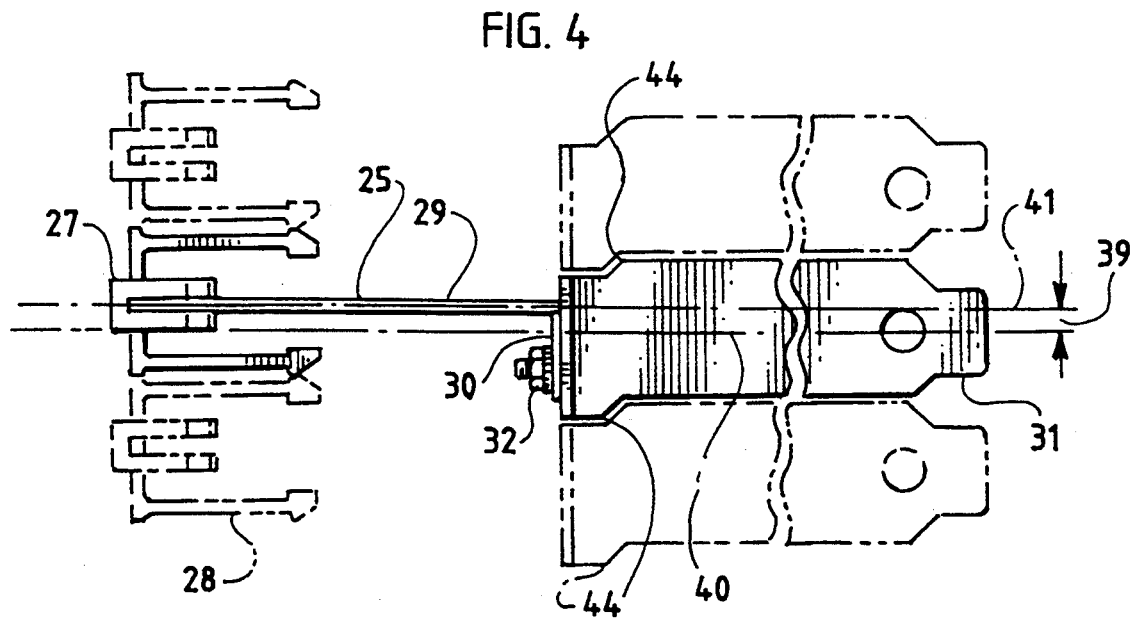
FIG. 4 is a top view illustrating the centerline offset of an AT card bracket relative to the centerline of the mounting bracket spine.
Figure 5A:
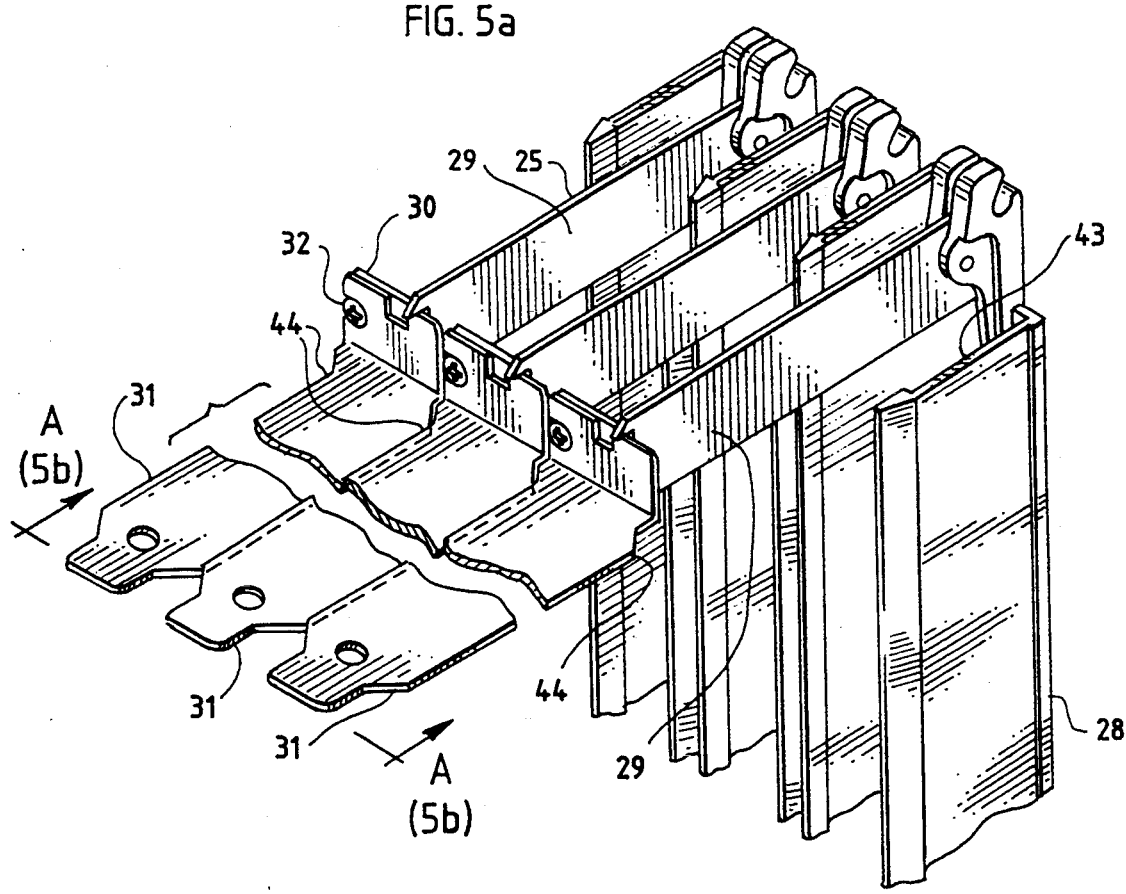
FIG. 5a is a top rear perspective view of an array of mounting brackets with a corresponding array of AT card brackets.
Figure 5B:
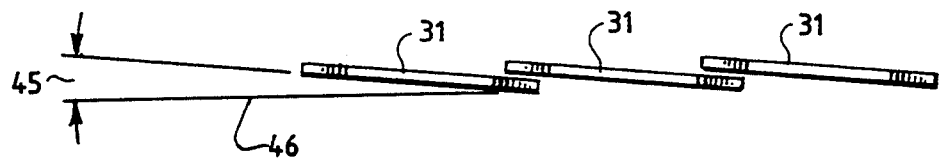
FIG. 5b is a rear view of adjacent AT card brackets taken along lines A—A of FIG. 5a and showing the offset stacking (or "shingling") arrangement of the present invention.
Figure 8A:
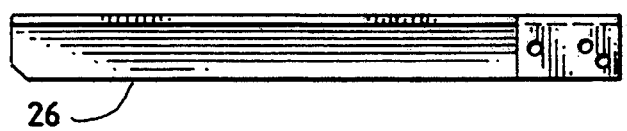
FIGS. 8a–8c are detailed drawings of a mounting bracket guide rail.
Figure 8B:
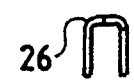
Figure 8C:
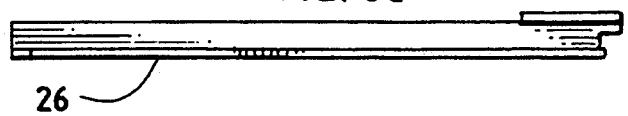
Figure 9D:
FIGS. 9a–9d are detailed drawings of the mounting bracket subassembly as shown in FIGS. 2a–2d.
Figure 9C:
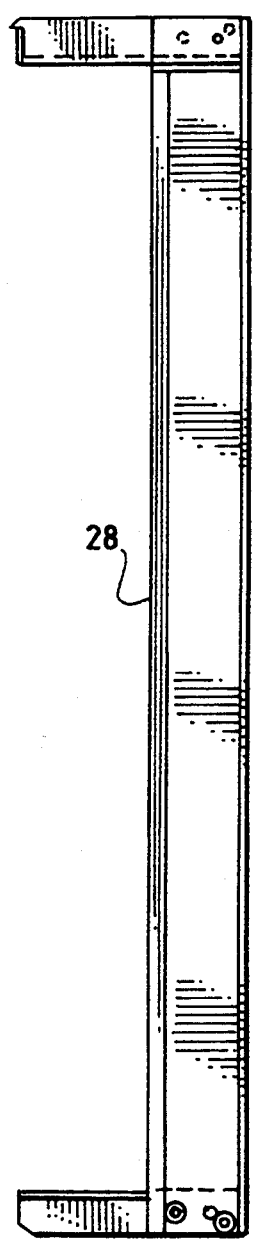
Figure 9B:
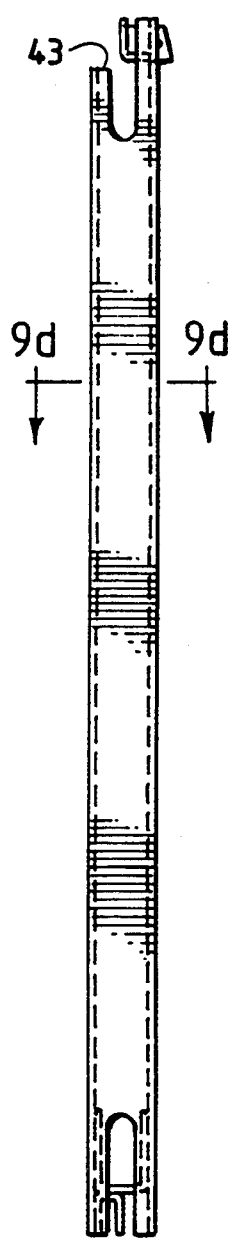
Figure 9A:
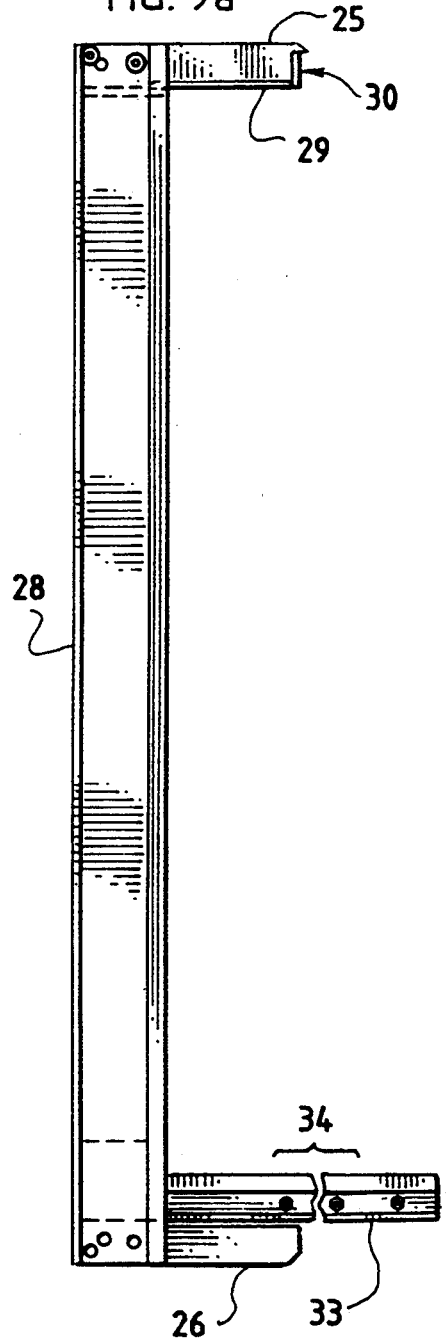

FIG. 4, FIG. 5a and FIG. 5b show the means provided by the present invention for increasing AT card density by decreasing spacing between adjoining AT cards 22. Increased AT card density is achieved by reducing spacing between adjacent mounting brackets 23, and adjacent AT card brackets 31 to achieve a desirable dimension of 0.8 inches between AT card centers. This spacing is achieved by the combination of three design parameters or techniques: (1) providing a fixed centerline differential between AT card bracket 31 and mounting bracket spine 28; (2) overlapping AT card brackets 31 by rotating them in the plane perpendicular to the AT cards; and (3) providing a notch 43 on one side of the mounting bracket spine 28 that provides removal clearance for AT card bracket holder 29, AT card bracket holder guide 30, and AT card bracket 31.

FIG. 4 is a top view of a mounting bracket assembly showing the desired off-set 39 between the centerline 40 of AT card bracket 31, and the centerline 41 of the mounting bracket spine. This arrangement ultimately aligns motherboard or passive backplane slots, located in computer housing 21, and having approximately 0.8 inch centers, to the spines 28 of inserted mounting brackets. The centerline differential 28 between the centerlines 40, 41 of the AT card brackets 31 and mounting bracket spines 28 should be in the preferred range of 0.2 inches, plus or minus 0.05 inch.

Successful insertion and extraction of adjacent mounting brackets 23 is achieved by eliminating interference with adjacent mounting bracket spines 28 and AT card brackets 31.

FIG. 5a shows a perspective top and rear view of the AT card bracket 31 and top of mounting bracket 23. Insertion and removal of AT card bracket 31 without interference of AT card bracket holder 29, AT card bracket holder guide 30 and fastening means 32 is achieved by the provision of notch 43 in one side of each mounting bracket spine 28.

FIG. 5b shows a rear view A—A of overlapping ("shingled") AT card brackets 31, thus allowing the insertion and removal of AT card bracket 31 without interference from tab 44 on each AT card bracket 31. Interference is eliminated by attaching AT card bracket 31 to AT card 22 and then affixing AT card bracket 31 via fastening means 32 to AT card bracket holder 29. AT card bracket holder 29 has means capable of rotating AT card bracket 31 such that the angle of rotation 45 measures between 2 and 10 degrees, with 4 degrees preferred. As shown in FIG. 5b, the angle of rotation 45 is measured from a reference plane 46 that is perpendicular to the plane containing the AT card 22 (see FIG. 1) when the AT card is held in place by the mounting bracket 23. The rotating capability is incorporated into the design of AT card bracket holder 29, AT card bracket holder guide 30 and fastening means 32.

While the invention is disclosed here in connection with a preferred embodiment, such disclosure is for purposes of illustration and description only. It is not intended to be exhaustive or to limit the invention to the precise forms disclosed. Many variations and modifications of the embodiments described herein will be obvious to one of ordinary skill in the art in light of this disclosure. The scope of the invention is to be defined by the appended claims and by their equivalents.

What is claimed is:

1. A mounting bracket suitable for holding an AT card in a motherboard or backplane slot, comprising:
    a mounting bracket spine having two sides and first and second ends; and
    an AT card bracket holder attached to the first end of the mounting bracket spine for receiving and securing an AT card bracket, where the AT card bracket holder has an AT card bracket holder guide that secures the AT card bracket at an angle of rotation between 2 degrees and 10 degrees from a reference angle.

2. The mounting bracket of claim 1 where the AT card bracket is attachable to a first edge of a first AT card, and where the AT card bracket holder guide secures the AT card bracket and the attached first AT card at an angle of rotation between 2 degrees and 10 degrees from a plane perpendicular to the horizontal plane of the motherboard or backplane, and permits a second AT card, attached to a second mounting bracket, to be inserted into a second motherboard or backplane slot adjoining the slot in which the first AT card is held such that the distance between the centers of the first and second AT cards is between 0.8 inches and 2.0 inches.

3. The mounting bracket of claim 1 further including a sliding AT card holder that can slide along the mounting bracket spine away from or toward the AT card bracket holder.

4. The mounting bracket of claim 3 where the sliding AT card holder can create a distance between the sliding card holder and the AT card bracket that is equal to the length of the AT card, and where the sliding card holder is attachable to a second edge of the AT card.

5. The mounting bracket of claim 1 further comprising first and second spring loaded lock/ejector levers, mounted on first and second ends of the mounting bracket spine, for securing and releasing the mounting bracket.

6. The mounting bracket of claim 1 further having a notch in one side of the mounting bracket spine at the first end of the spine, where said notch permits insertion and extraction of the mounting bracket from the motherboard without obstruction by an adjoining mounting bracket.

7. A mounting bracket suitable for holding an AT card in a motherboard or backplane slot, comprising:
a mounting bracket spine having two sides and first and second ends;
an AT card bracket holder attached to the first end of the mounting bracket spine for receiving and securing an AT card bracket, where the AT card bracket holder has an AT card bracket holder guide that secures the AT card bracket at an angle of rotation between 2 degrees and 10 degrees from a reference angle, and where the distance between the centers of the AT card and a second AT card held in an adjoining motherboard or backplane slot by a second mounting bracket is between 0.8 inches and 2.0 inches.

8. The mounting bracket of claim 7 further including a sliding AT card holder that can slide along the mounting bracket spine away from or toward the AT card bracket holder.

9. The mounting bracket of claim 8 where the sliding AT card holder can create a distance between the sliding card holder and the AT card bracket that is equal to the length of the AT card, and where the sliding card holder is attachable to a second edge of the AT card.

10. The mounting bracket of claim 7 further comprising first and second spring loaded lock/ejector levers, mounted on first and second ends of the mounting bracket spine for securing and releasing the mounting bracket.

11. The mounting bracket of claim 7 further having a notch in one side of the mounting bracket spine at the first end of the spine, where said notch permits insertion and extraction of the mounting bracket from the motherboard without obstruction by an adjoining mounting bracket.

12. A mounting bracket suitable for holding AT cards of various lengths in a motherboard or backplane slot, comprising:
a mounting bracket spine having two sides and first and second ends;
an AT card bracket holder attached to the first end of the mounting bracket spine for receiving and securing an AT card bracket; and
a sliding AT card holder that can slide along the mounting bracket spine away from or toward the AT card bracket holder.

13. The mounting bracket of claim 12 where the sliding AT card holder can create a distance between the sliding card holder and the AT card bracket that is equal to the length of the AT card, and where the sliding card holder is attachable to a second edge of the AT card.

14. The mounting bracket of claim 12 further comprising first and second spring loaded lock/ejector levers, mounted on first and second ends of the mounting bracket spine, for securing and releasing the mounting bracket.

15. The mounting bracket of claim 12 further having a notch in one side of the mounting bracket spine at the first end of the spine, where said notch permits insertion and extraction of the mounting bracket from the motherboard without obstruction by an adjoining mounting bracket.

* * * * *